United States Patent
Abe

(10) Patent No.: US 7,192,858 B2
(45) Date of Patent: Mar. 20, 2007

(54) METHOD OF FORMING PLUG

(75) Inventor: Kazuhide Abe, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 396 days.

(21) Appl. No.: 10/352,871

(22) Filed: Jan. 29, 2003

(65) Prior Publication Data

US 2004/0058525 A1    Mar. 25, 2004

(30) Foreign Application Priority Data

Sep. 25, 2002   (JP) .............................. 2002-278282

(51) Int. Cl.
H01L 21/44    (2006.01)

(52) U.S. Cl. ................ 438/597; 257/E21.536

(58) Field of Classification Search ........ 438/637–640, 438/783, 780, 627, 643, 672, 680, 681
See application file for complete search history.

(56) References Cited

U.S. PATENT DOCUMENTS

| | | | |
|---|---|---|---|
| 5,391,394 A * | 2/1995 | Hansen ...................... 427/124 |
| 5,661,344 A * | 8/1997 | Havemann et al. .......... 257/758 |
| 5,858,106 A * | 1/1999 | Ohmi et al. .................... 134/1 |
| 6,083,824 A * | 7/2000 | Tsai et al. .................... 438/629 |
| 6,165,905 A | 12/2000 | Annapragada | |
| 6,187,624 B1 * | 2/2001 | Huang ........................ 438/253 |
| 6,200,735 B1 | 3/2001 | Ikegame | |
| 6,251,753 B1 * | 6/2001 | Yeh et al. ................... 438/445 |
| 6,413,438 B1 | 7/2002 | Ikegame | |

FOREIGN PATENT DOCUMENTS

| | | |
|---|---|---|
| JP | 05-102148 | 4/1993 |
| JP | 06-163714 | 6/1994 |
| JP | 07-045613 | 2/1995 |
| JP | 9-27473 | * 1/1997 |
| JP | 11-297829 | 10/1999 |
| JP | 2000-150646 | 5/2000 |
| JP | 2000-164699 | 6/2000 |
| JP | 2001-110899 | 4/2001 |
| JP | 2001-118925 | 4/2001 |

OTHER PUBLICATIONS

O2 Plasma Treatment of Low-k Organic Silsesquioxane for Novel Intermetal Dielectric Application T. Yoshie, S. C. Chen and J. Kanamori pp. 461-465, VLSI R&D Center, Oki electric Industry Co. Ltd. Date: Unknown.

* cited by examiner

Primary Examiner—Scott B. Geyer
(74) Attorney, Agent, or Firm—Volentine & Whitt, P.L.L.C.

(57) ABSTRACT

A method of producing a semiconductor device includes, in order to electrically connect a lower layer wiring and an upper layer wiring opposite to each other with an interlayer insulation film intervening between them, a step of forming a via-hole, which exposes the lower layer wiring upward from the lower layer wiring through the interlayer insulation film, a step of forming a protective film for preventing erosion, and a step of forming a plug for electrically connecting the lower layer wiring to the upper layer wiring, wherein the protective film is formed by a CVD process in order to cover a residue having stuck to the inner wall of the hole concerned during forming the via-hole.

25 Claims, 7 Drawing Sheets

METHOD OF FORMING PLUG

BACKGROUND OF THE INVENTION

1. Field of the Invention

The present invention relates to a method of forming a plug, relates more particularly to a method of forming a plug embedded in a via-hole of a semiconductor device having multilayer wirings.

2. Description of the Related Art

A semiconductor device with highly integrated semiconductor elements is provided with wirings multilayered in the device concerned. The wirings are configured to reduce wiring widths and wiring gaps in order to integrate highly the semiconductor elements. Since delay of a signal is enlarged due to an increase in capacitance between wirings resulting from the reduction in the wiring widths and wiring gaps, a material with low dielectric constant has been used as an interlayer insulating film between the wirings for reducing the delay.

As a low dielectric constant material, for example, counted is silicon oxide with dielectric constant of around 2.5 comprising Silsesquioxane ($Si_2O_3$) as the main raw material or Silsesquioxane with Si—H radical or Si—$CH_3$ radical as the main raw material. However, a typical low dielectric constant material comprising Silsesquioxane except oxide with fluorine addition as the main raw material is liable to be eroded by a $WF_6$ gas. Further, it is also known that the low dielectric constant material is generally weak in heat treatment in oxygen and in oxygen plasma, and is liable to be oxidized by active oxygen generated in oxygen plasma through an ashing process with oxygen plasma called as "ashing".

Now, a conventional method of producing such kind of semiconductor device 100 will be described referring to FIG. 10 and FIG. 11.

FIG. 10 shows a conventional semiconductor device 100 on the way to production.

In FIG. 10, after forming a lower layer wiring 12 at a predetermined location using a predetermined pattern on a semiconductor substrate 11 with semiconductor elements not shown in the figure, an interlayer insulation film 13 is formed using a low dielectric constant material represented by Silsesquioxane covering the lower layer wiring 12 and the semiconductor substrate 11. Then, forming an oxide film 14 over the interlayer insulation film 13, a via-hole 16 is formed using a resist film for selectively etching the oxide film 14 and the interlayer insulation film 13. Next, while removing the resist film having been used for forming the via-hole by an ashing process called "ashing", a silicon dioxide film is formed as a guard film 18 on the inner wall of the via-hole 16. Then, after forming a barrier metal film 22 over the oxide film 14 by sputtering, a plug is formed in the via-hole 16.

Adding to the conventional semiconductor device above, there are a conventional semiconductor device having a protective film and a barrier metal film for preventing erosion against an interlayer insulation film and a conventional semiconductor device having an organic SOG (Spin-On-Glass) protective layer and a barrier film (refer to FIG. 1 and FIG. 4 in JP, 11-297829, A).

The protective film and the organic SOG protective layer are formed for preventing erosion against the interlayer insulation film by a stripping solution during removing the resist film having been used out for forming the via-hole by the wet stripping solution concerned.

Further, with regard to a semiconductor device formed using an interlayer insulation film, which is selectively etched, there are a conventional semiconductor device having an adhesive layer and a conventional semiconductor device having a barrier layer in place of the adhesive layer concerned (refer to FIG. 1 and FIG. 2 in JP, 2001-118925, A).

The adhesive layer is formed between a plug formed in a via-hole and an interlayer insulation film in order to make the plug adhere to the interlayer insulation film, and the barrier layer is formed for preventing diffusion of a copper wiring and a copper plug from the via-hole to the interlayer insulation film.

Besides, in a conventional semiconductor device 100, as shown in FIG. 11, although an inner wall of a via-hole is protected with a guard film 18 and a barrier metal film 22, the inner wall of the via-hole has been eroded by the $WF_6$ gas used for forming a plug.

Here, the present inventor found out that the cause of erosion of the via-hole's inner wall was due to etching of a lower layer wiring 12 by sputtering during a formation process of the via-hole 16. That is to say, it was found that when the lower layer wiring 12 was exposed as the etching process proceeded, the top portion of the lower layer wiring 12 concerned was sputtered, and the surface of the lower layer wiring 12 was shaved off, and the dust as a residue 17 (refer to FIG. 11) stuck to the inner wall of the via-hole. It was also proved that a residue 17 was significantly generated when a borderless via-hole is formed at the unmatched location above the lower layer wiring 12. The reason is considered because an edge portion of the lower layer wiring 12 is liable to be shaved off, as the strength of the edge portion of the lower layer wiring 12 concerned is weak.

On the other hand, when a resist film having used for forming the via-hole is removed, an ashing process using oxygen plasma, so-called ashing, is performed as mentioned above. However, it was also found in the ashing process that since the oxygen plasma is accelerated to radiate in the direction from the top toward the bottom of the interlayer insulation film 13 through which the via-hole 16 is formed, the oxygen plasma is shielded by the residue 17 and consequently a guard film is not formed on the inner wall below the residue sticking to the via-hole 16.

Further, it was also found that the guard film 18 was not formed only on the inner wall below the residue 17 but also on the periphery, to which the residue is sticking, of the inner wall of the via-hole 16.

Further, although a barrier metal film 22 is formed by depositing titanium nitride (TiN) by sputtering where metal is physically deposited, it was also found out that the barrier metal film was not formed on the inner wall of the via-hole shielded by the residue 17, so that the guard film was not formed on the lower portion of the inner wall of the via-hole.

In the case where the guard film 18 and the barrier metal film 22 is not formed on the lower portion of the inner wall of the via-hole 16, as shown in FIG. 11, once a CVD (Chemical Vapor Deposition) process using the $WF_6$ gas for forming a plug is performed, the interlayer insulation film 13 is eroded at the lower portion of the inner wall of the via-hole or the inner wall around the residue 17 which is not covered by the guard film 18 and the barrier metal film 22. That is to say, erosion occurs due to direct contact of the interlayer insulation film 13 with the $WF_6$ gas.

SUMMARY OF THE INVENTION

The object of the present invention is to provide a semiconductor device in which an inner wall of a via-hole is never eroded by a gas for forming a plug and a production method of forming the device concerned.

The present invention employs the following constitution in order to solve the preceding problems.

A method of producing a semiconductor device includes, in order to electrically connect a lower layer wiring and an upper layer wiring opposite to each other with an interlayer insulation film intervening between them, a step of forming a via-hole, which exposes the lower layer wiring upward from the lower layer wiring through the interlayer insulation film, a step of forming a protective film over the inner wall of the via-hole concerned for preventing erosion of the interlayer insulation film, and a step of forming a plug for electrically connecting the lower layer wiring to the upper layer wiring with the protective film intervening between the plug and the hole, wherein the protective film is formed by a CVD process in order to cover a residue having stuck to the inner wall of the hole concerned during forming the via-hole.

The interlayer insulation film can be composed of a low dielectric constant material.

The plug can be formed by chemical vapor deposition using a tungsten hexafluoride gas.

The via-hole can be formed as a borderless via-hole at the unmatched location above the lower layer wiring.

A semiconductor device includes a lower layer wiring and an upper layer wiring opposite to each other by means of a via-hole provided in an interlayer insulation film, a protective film provided over the inner wall of the via-hole foe preventing erosion of the interlayer insulation film, and a plug provided in the via-hole for electrically connecting the lower layer wiring and the upper layer wiring, wherein the protective film is formed by a CVD process in order to cover a residue having stuck to the inner wall of the hole concerned during forming the via-hole.

The interlayer insulation film can be composed of a low dielectric constant material.

The plug can be formed by chemical vapor deposition using the tungsten hexafluoride gas.

The via-hole can be formed as a borderless via-hole at the unmatched location above the lower layer wiring.

DETAILED DESCRIPTION OF THE INVENTION

In the following, an embodiment of the present invention will be described using FIG. 1–FIG. 9.

Figure 1:
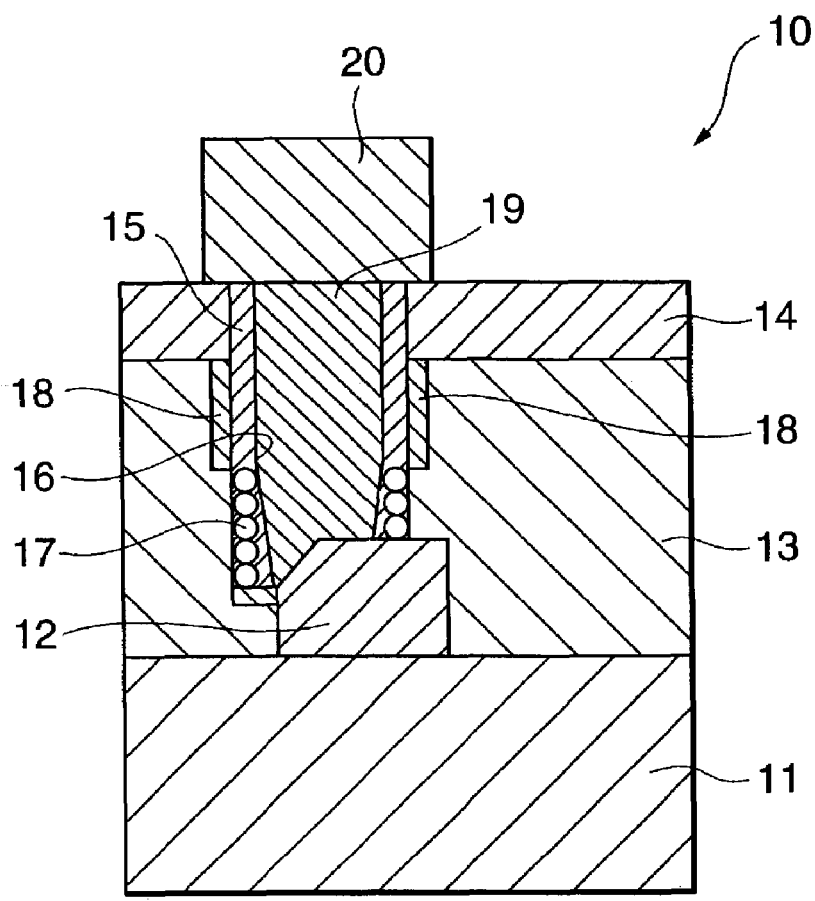
FIG. 1 is a cross section of a semiconductor device 10 of the present invention.

FIG. 1 is a cross section showing a semiconductor device 10 of the present invention. The semiconductor device 10 has a semiconductor substrate 11 on which semiconductor elements not shown in the figure is formed, lower layer wirings 12 formed at predetermined locations on the substrate 11 concerned, an interlayer insulation film 13 for stacking wirings above the lower layer wirings 12 concerned, an oxide film 14 formed over the interlayer insulation film 13 concerned, a via-hole called a borderless via-hole formed at the location overlapping the upper edge portion of the lower layer wiring 12, a residue 17 sticking to an inner wall of the via hole 16 concerned, a guard film 18 for guarding the inner wall of the via-hole 16 except the lower portion of the hole to which the residue 17 is stuck, a protective film 15 formed over the inner wall of the via-hole covering the guard film 18 and the residue 17 concerned, and a plug 19 provided in the via-hole, over which the protective film is formed, for electrically connecting the lower layer wiring 12 and the upper layer wiring 20.

For the interlayer insulation film 13 used in the semiconductor device 10 of the present invention, a low dielectric constant material with low dielectric constant is used. As a low dielectric constant material, for example, known is silicon oxide with dielectric constant of around 2.5 comprising Silsesquioxane ($Si_2O_3$) as the main raw material or Silsesquioxane with Si—H radical or Si—$OH_3$ radical as the main raw material.

A low dielectric constant material comprising Silsesquioxane except fluorine added oxide as the main raw material is weak in heat treatment in oxygen and in oxygen plasma, and is liable to be oxidized, when an ashing process called as ashing is performed, by active oxygen generated through the ashing concerned. Also, the low dielectric constant material is eroded by a tungsten hexafluoride ($WF_6$) gas as mentioned above.

Next, a method of producing the semiconductor device 10 will be described using FIG. 1–FIG. 9.

Figure 2:
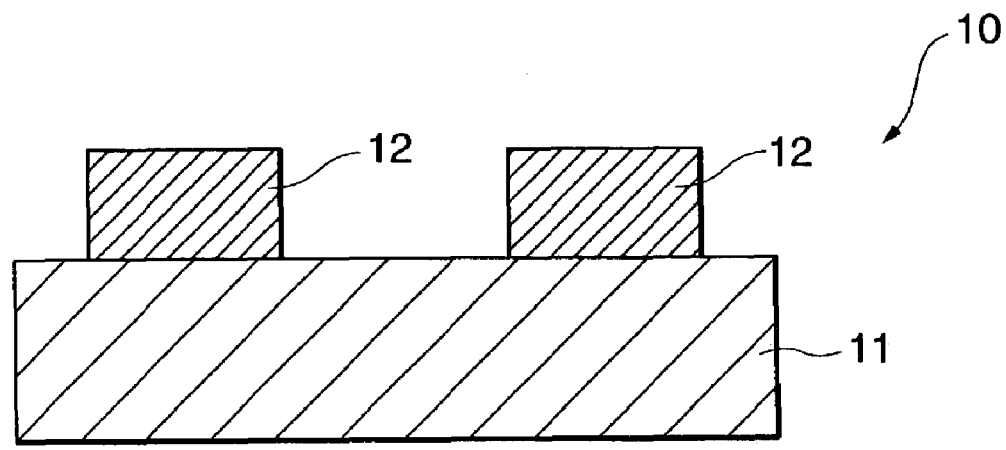
FIG. 2 is a cross section showing lower layer wirings 12 formed on a semiconductor substrate 11.

First of all, as shown in FIG. 2, lower layer wirings are formed with a predetermined pattern on the semiconductor substrate 11 having semiconductor elements not shown in the figure. That is to say, after forming a film of aluminum (Al) alloy on the semiconductor substrate 11, a film of titanium nitride (TiN), for example, is formed following the forming of the film of aluminum alloy, as a ARM (Anti Reflection Metal) during the predetermined patterning of the high reflectivity aluminum alloy, in order not to make any voids in aluminum alloy, for improving resistance against electro-migration, and further for enhancing resistance against thermal stress. Performing etching these films with a predetermined pattern, the lower layer wirings 12 are formed.

Figure 3:
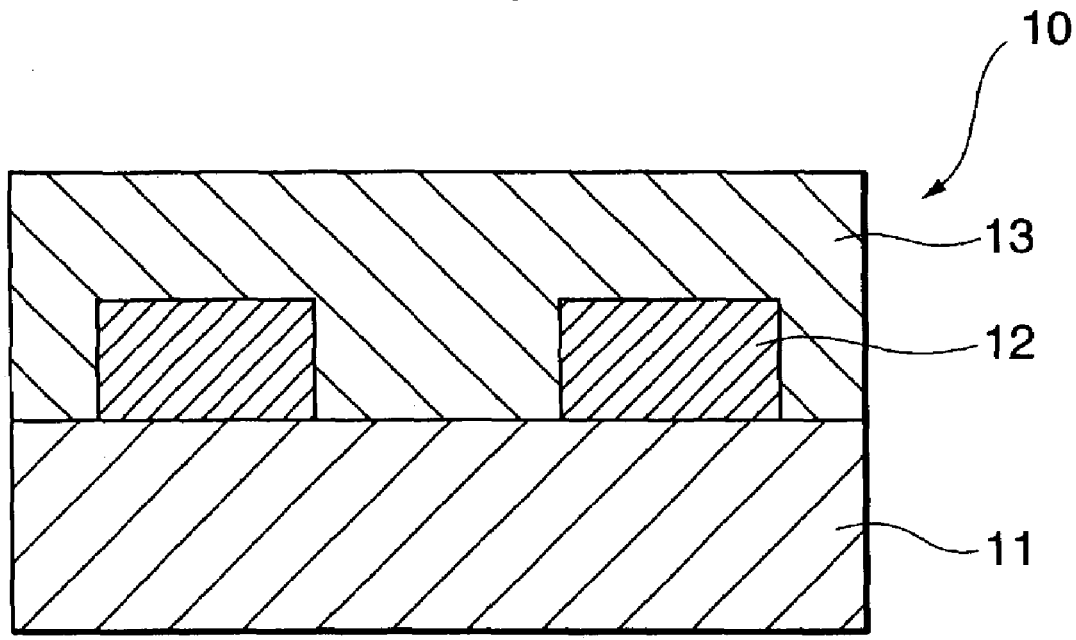
FIG. 3 is a cross section showing an interlayer insulation film 13 covering the lower layer wirings 12 over the semiconductor substrate.

After forming the lower layer wiring 12, as shown in FIG. 3, an interlayer insulation film 13 of the low dielectric constant material is formed on the semiconductor substrate 11 by a coating method such as a spin-coating. The interlayer insulation film 13 concerned is formed on the semiconductor substrate 11 with a predetermined size in thickness covering the lower layer wiring 12.

Figure 4:
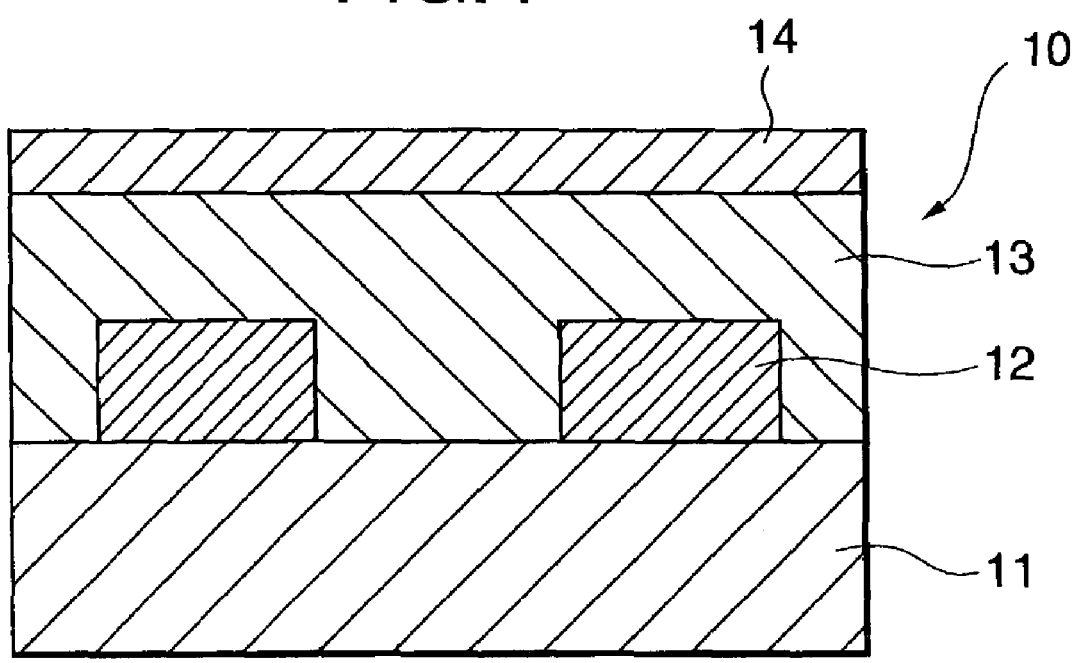
FIG. 4 is a cross section showing an oxide film 14 formed over the interlayer insulation film 13.

Next, after forming the interlayer insulation film 13, as shown in FIG. 4, an oxide film 14 is formed over the interlayer insulation film 13 by a plasma CVD process. The oxide film 14 concerned can prevent the interlayer insulation film 13 from oxidation at its upper surface during removing a resist film 21 as described later.

Figure 5:
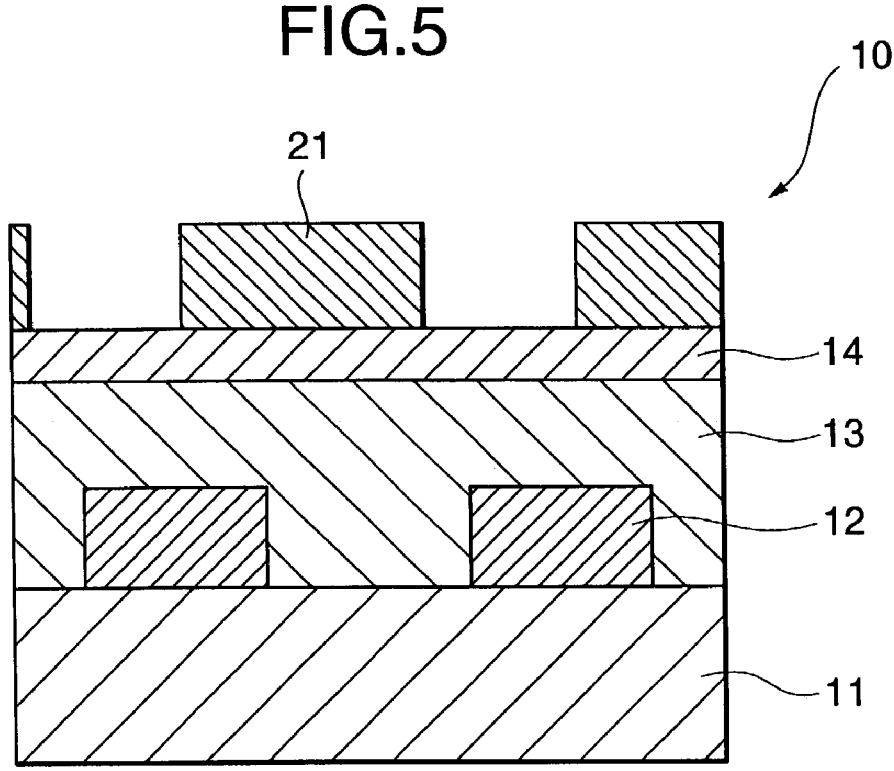
FIG. 5 is a cross section showing a resist film 21 formed over the oxide film 14.

After forming the oxide film 14, as shown in FIG. 5, a resist film 21 for forming a via-hole is formed at predetermined locations on the oxide film 14 concerned.

Figure 6:
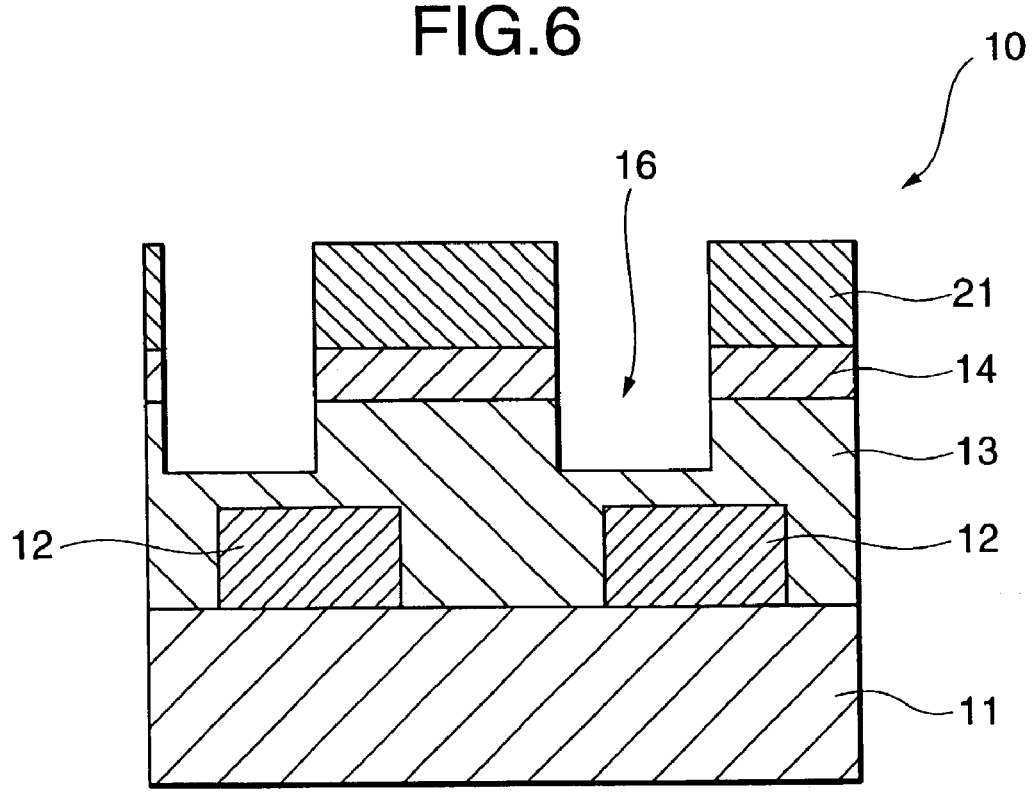
FIG. 6 is a cross section showing a via-hole 16 formed in the interlayer insulation film 13.

After forming the resist film 21, as shown in FIG. 6, a via-hole 16 is formed by etching the oxide film 14 and the interlayer insulation film 13, which are not covered by the resist film 21, using a RIE (Reactive Ion Etching) process.

The via-hole 16 formed according to the present invention is a so-called borderless via-hole, which is formed not right above the lower layer wiring but offsetting the lower layer wiring 12.

Figure 7:
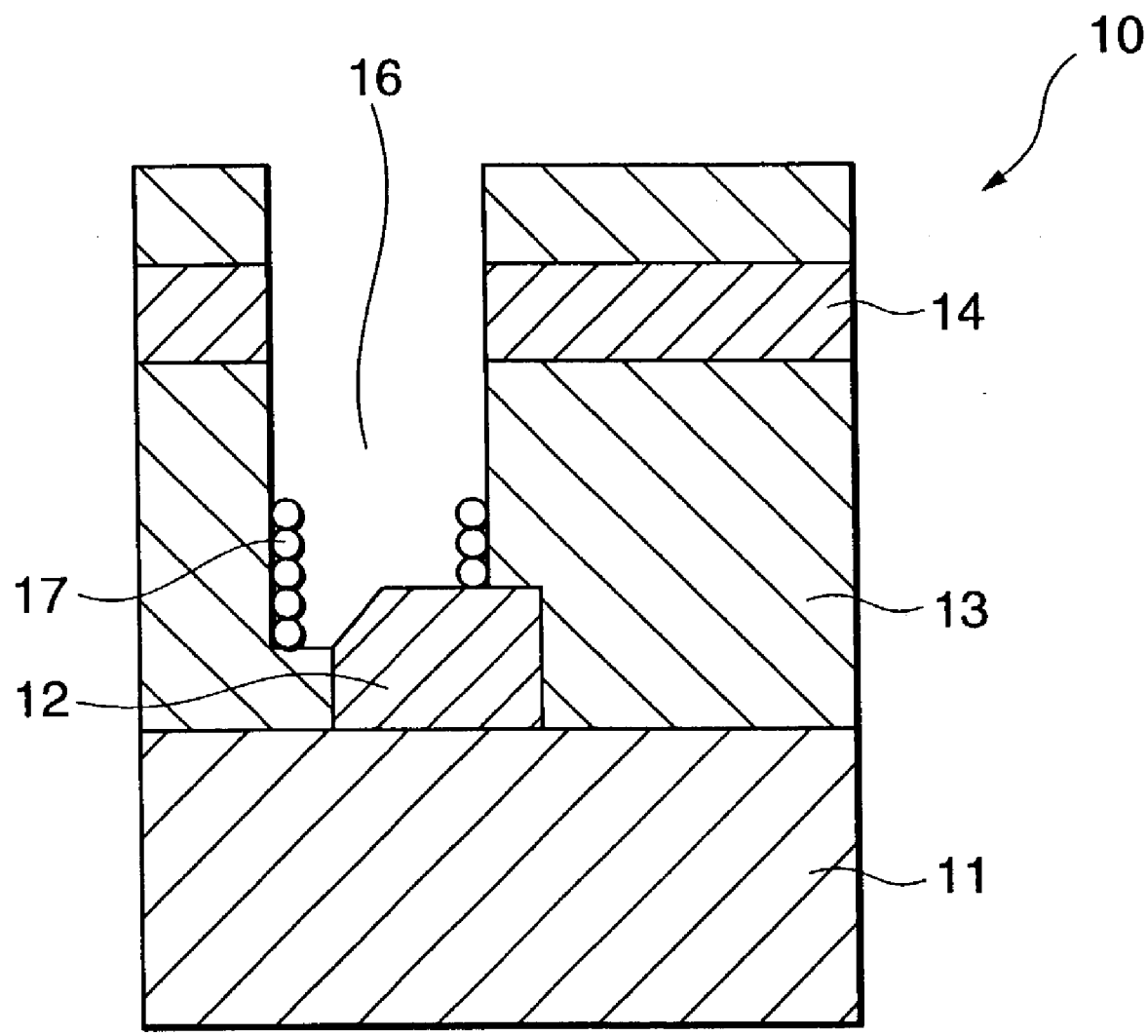
FIG. 7 is a cross section showing a residue 17 sticking to the inner wall of the via-hole 16.

When etching reaches the upper portion of the lower layer wiring 12, a corner of the upper portion of the lower layer wiring 12 is sputtered, as shown in FIG. 7. Thereby, the dust of the upper edge portion of the lower layer wiring 12 shaved by sputtering sticks to the inner wall of the via-hole 16 as a residue 17.

The main constituents of the formed residue 17 are a low dielectric constant material of the interlayer insulation film, Al and Cu from aluminum alloy of the lower layer wiring 12, Ti, N, etc. from titanium nitride and so forth, wherein their ratios of mixing vary among every residue. Therefore, if it is tried to use such a cleaning solution as effective to every residue, it is liable to occur that not only the residue but also the interlayer insulation film 13, the lower layer wiring 12, etc. are eroded by the cleaning solution. Consequently, it is difficult to completely remove the residue 17 in the via-hole 16, and the residue 17, which cannot be removed by cleaning remains in the inner wall of the via-hole 16.

Figure 8:
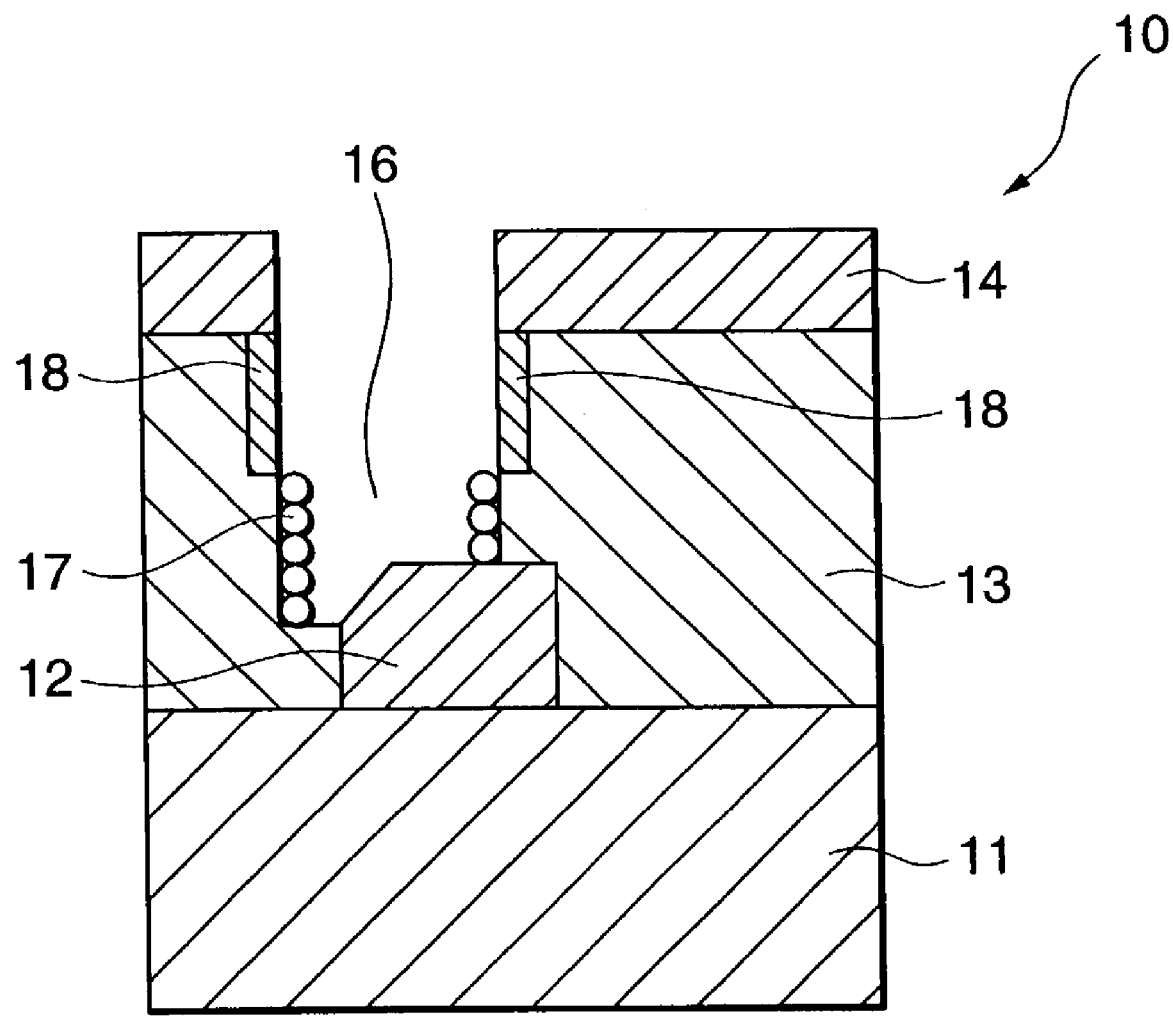
FIG. 8 is a cross section showing a guard film 18 formed through removing the resist film 18.

When formation of the via-hole 16 is finished, as shown in FIG. 8, a resist film 21 formed on the semiconductor substrate 11 with the oxide film 14 and the interlayer insulation film 13 intervening between them is removed by an oxygen plasma RIE ($O_2$-Reactive Ion Etching, hereafter referred to $O_2$-RIE) process. This method of removing the resist film 21 is disclosed in T. Yoshie, et al., Proceedings of Advanced Metallization Conference (AMC) 2000, p 461. In the $O_2$-RIE process, after a wafer comprising each semiconductor device 11 is mounted on a stage not shown in the figure and electric potential (bias) to the stage concerned is controlled. The electric potential is controlled in the direction toward from the front surface of the resist film 21 to the rear surface of the resist film 21, namely in the direction toward from the front surface of the resist film 21 to the semiconductor substrate 11. When ashing using oxygen plasma is performed in the field where the electric potential is controlled in such a manner, active oxygen being generated by the oxygen plasma concerned is drifted in the direction toward which the electric potential is controlled. The oxygen plasma is irradiated accelerating at a nearly perpendicular angle to the wafer. Therefore, the oxygen plasma is irradiated along the inner wall of the via-hole 16, and thereby the lower portion of the inner wall shielded by the residue 17 sticking to the via-hole 16 and the periphery of the inner wall to which the residue 17 is sticking are difficult to be irradiated.

Besides, since a low dielectric constant material is oxidized by oxygen plasma generating active oxygen as mentioned above, the inner wall of the via-hole 16 formed in the interlayer insulation film 13 comprising a low dielectric constant material is oxidized and the resist film 21 is removed, resulting in formation of silicon dioxide by this oxidation as a guard film 18. Since the oxygen plasma generating active oxygen, as mentioned above, is difficult to be irradiated to the inner wall under the residue 17 sticking to the via-hole 16 and the inner wall around the residue 17, the guard film 18 is never formed over the lower portion of the inner wall concerned and the periphery of the inner wall to which the residue 17 is sticking.

Figure 9:
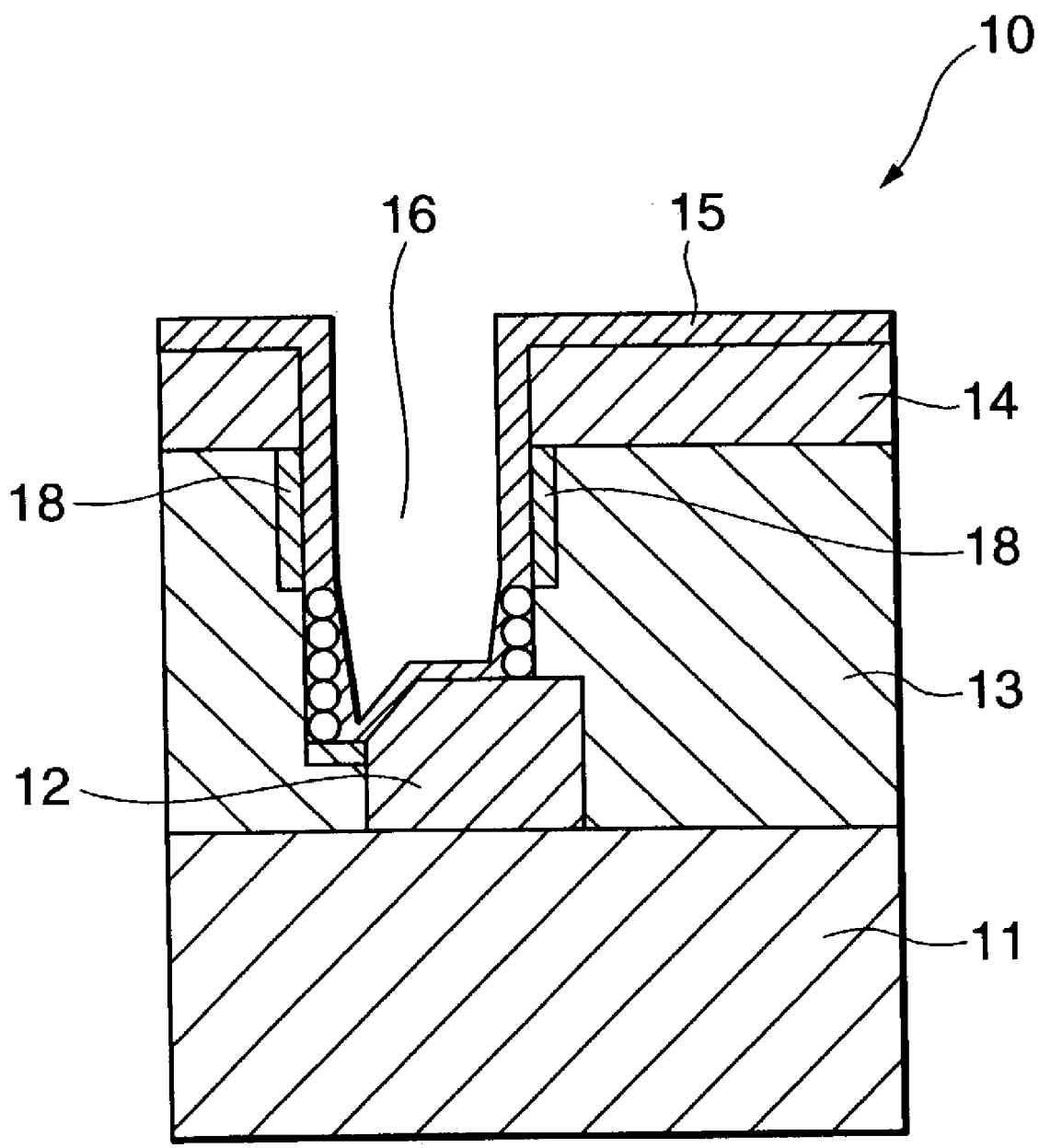
FIG. 9 is a cross section showing a protective film 15 covering the inner wall of the via-hole and the residue together.
Figure 10:
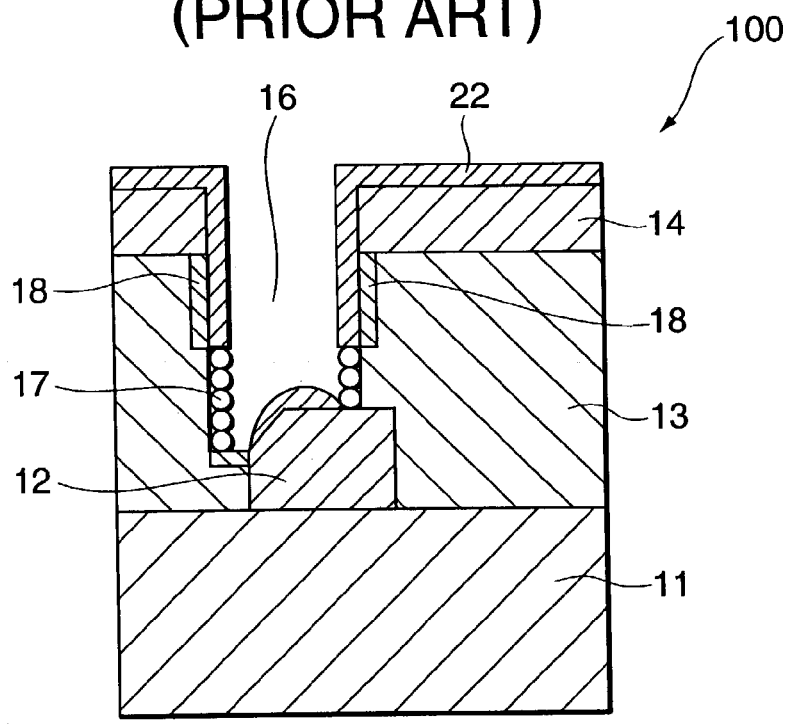
FIG. 10 is a cross section showing a conventional semiconductor device in which a barrier film is formed.
Figure 11:
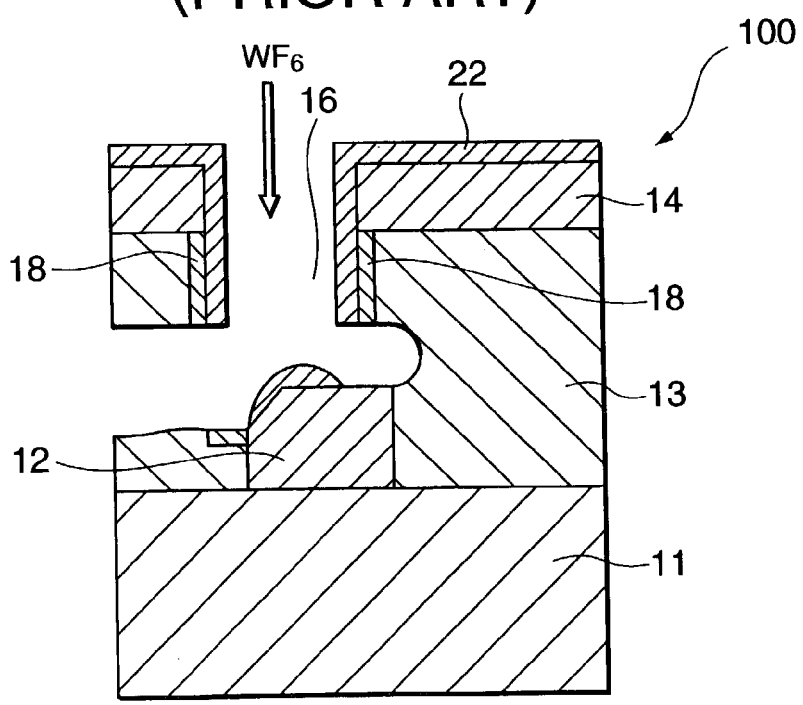
FIG. 11 is a cross section showing a conventional semiconductor device having an interlayer insulation film eroded by tungsten hexafluoride.

Further, since the interlayer insulation film 13 using a low dielectric constant material is exposed on the inner wall of the via-hole not covered by the guard film, the inner wall is eroded by the $WF_6$ gas during forming a plug 19 described later. In order to prevent the erosion, as shown in FIG. 9, a protective film 15 is formed. The protective film 15 concerned covers the oxide film 14 and the inner wall of the via-hole as well as the residue 17.

The protective film 15 is formed using a CVD process. The CVD process concerned, after disposing a wafer comprising semiconductor substrate 11 on which the guard film 18 has been formed at a predetermined place in an evacuatable container, forms the protective film 15 on the wafer concerned, at a deposition temperature less than 450 degrees, under a deposition pressure of a few ten thousands Pa, using Tetraethoxysilane (TEOS; Tetraethylorthosilicate; $Si(OC_2H_5)_4$) and oxygen ($O_2$). Thereby, a silicon dioxide film is formed in the via-hole 16 and on the oxide film 14 as the protective film 15. Since the protective film 15 formed according to the present invention is not a physically formed film by a sputtering process like a barrier film formed in a conventional semiconductor device but a chemically deposited film, the protective film 15 can be formed throughout the entire inner wall of the via-hole 16 with good step coverage even at the inner wall under the residue 17 sticking to the via-hole and at the periphery of the inner wall to which the residue 17 is sticking.

After forming the protective film 15, as shown in FIG. 1, the unnecessary protective film 15 on the lower layer wiring 12 except the inner wall of the via-hole 16 is removed by a directional etching process, and then a plug 19 is formed in the via-hole by a CVD process using the $WF_6$ gas. Even if the $WF_6$ gas is used for forming the plug 19, there is no possibility for the interlayer insulation film to be eroded, because the inner wall under the residue 17 sticking to the via-hole and the periphery of the inner wall to which the residue 17 is sticking can be covered by the protective film.

After forming the plug 19, an upper layer wiring 20 is formed in the same manner as that for the lower layer wiring 12.

As mentioned above, since the inner wall of the via-hole is covered by the guard film 18 and further both the inner wall under the residue 17 sticking to the via-hole and the periphery of the inner wall to which the residue 17 is sticking, which are not covered by the guard film 18 can be covered together with the residue 17 by the protective film 15 before forming the plug 19, there is no possibility for the interlayer insulation film to be eroded by the $WF_6$ gas.

According to the present invention, even if a residue 17 generated during forming a via-hole 16 in an interlayer insulation film 13 using a low dielectric constant material sticks to the inner wall of the via-hole concerned, since the inner wall of the via-hole 16 as well as the residue 17 is covered by a protective film 15 by a CVD process, erosion by the gas during forming a plug can be prevented.

Further, according to a production method of the present invention, the protective film 15 can be formed without using a particular apparatus and a semiconductor device 10 can be produced reducing plant investment.

According to the present invention, even if a residue generated by sputtering during forming a via-hole by sputtering etching in an interlayer insulation film above a lower layer wiring sticks to the inner wall of the via-hole, since the inner wall of the via-hole as well as the residue is covered by a protective film through forming the protective film over the inner surface of the via-hole concerned by a CVD process, erosion into the interlayer insulation film by the gas during forming a plug in the hole can be prevented. Consequently, the yield of defective products due to the erosion can be reduced through preventing the erosion of the interlayer insulation film, and the semiconductor devices can be produced efficiently.

What is claimed is:

1. A method of manufacturing a semiconductor device having a plug, comprising:
    preparing a semiconductor substrate;
    forming a conductive pattern on the semiconductor substrate;
    forming an insulating layer on the semiconductor substrate to cover the conductive pattern, the insulating layer including a low dielectric constant material;
    forming a via-hole in the insulating layer to expose the conductive pattern using a resist layer as a mask, the via-hole having an inner wall;
    removing the resist layer by an oxygen reactive plasma etching so that a first protective layer is formed on the inner wall of the via-hole;
    forming a second protective layer on an entirety of the inner wall of the via-hole including the first protective layer; and
    forming a plug on the second protective layer so that the plug fills the via-hole.

2. The method of manufacturing a semiconductor device according to claim 1, wherein said forming an insulating layer includes:
    forming a first insulating layer on the semiconductor substrate, the first insulating layer including the low dielectric constant material; and
    forming a second insulating layer on the first insulating layer, the second insulating layer being formed of an oxide material.

3. The method of manufacturing a semiconductor device according to claim 2, wherein said forming a first insulating layer is conducted by a spin coating method.

4. The method of manufacturing a semiconductor device according to claim 1, wherein the low dielectric constant material includes silsesquioxane.

5. The method of manufacturing a semiconductor device according to claim 1, wherein said forming a conductive pattern includes:
    forming an aluminum alloy layer on the semiconductor substrate;
    forming an antireflection metal layer on the aluminum alloy layer; and
    patterning the aluminum alloy layer and the antireflection metal layer to form the conductive pattern.

6. The method of manufacturing a semiconductor device according to claim 1, wherein the via-hole exposes an edge portion of the conductive pattern.

7. The method of manufacturing a semiconductor device according to claim 1, wherein a residue is deposited near a bottom portion of the inner wall of the via-hole during said removing the resist layer.

8. The method of manufacturing a semiconductor device according to claim 1, wherein $WF_6$ gas is used during said forming a plug.

9. The method of manufacturing a semiconductor device according to claim 1, wherein the second protective layer includes tetraethylorthosilicate.

10. A method of manufacturing a semiconductor device comprising:
    forming a conductive pattern on the semiconductor substrate;
    forming a first insulating layer on the semiconductor substrate and the conductive pattern, the first insulating layer including a low dielectric constant material;
    forming a second insulating layer on the first insulating layer, the second insulating layer being formed of an oxide material;
    forming a resist pattern on the second insulating layer;
    forming a via-hole in the first and second insulating layers to expose the conductive pattern using the resist pattern as a mask, the via-hole having an inner wall;
    removing the resist pattern by an oxygen reactive plasma etching so that the inner wall of the via-hole within the first insulating layer is oxidized so as to form a first protective layer;
    forming a second protective layer on an entirety of the inner wall of the via-hole including the first protective layer; and
    forming a plug on the second protective layer so that the plug fills the via-hole.

11. The method of manufacturing a semiconductor device according to claim 10, wherein said forming a first insulating layer is conducted by a spin coating method.

12. The method of manufacturing a semiconductor device according to claim 10, wherein the low dielectric constant material includes silsesquioxane.

13. The method of manufacturing a semiconductor device according to claim 10, wherein said forming a conductive pattern includes:
    forming an aluminum alloy layer on the semiconductor substrate;
    forming an antireflection metal layer on the aluminum alloy layer; and
    patterning the aluminum alloy layer and the antireflection metal layer to form the conductive pattern.

14. The method of manufacturing a semiconductor device according to claim 10, wherein the via-hole exposes an edge portion of the conductive pattern.

15. The method of manufacturing a semiconductor device according to claim 10, wherein a residue is deposited near a bottom portion of the inner wall of the via-hole during said removing the resist pattern.

16. The method of manufacturing a semiconductor device according to claim 10, wherein $WE_6$ gas is used during said forming a plug.

17. The method of manufacturing a semiconductor device according to claim 10, wherein the second protective layer includes tetraethylorthosilicate.

18. A method of manufacturing a semiconductor device comprising:
    forming a conductive pattern on a semiconductor substrate;
    forming a low dielectric constant insulating layer on the semiconductor substrate and the conductive pattern;

forming an oxide insulating layer on the low dielectric constant insulating layer;

forming a via-hole having an inner wall in the insulating layers to expose the conductive pattern using a resist pattern as a mask;

subjecting the resist pattern and the via-hole to an oxygen reactive plasma so that the resist pattern is removed and the inner wall of the via-hole within the first insulating layer is oxidized so as to form a first protective layer;

forming a second protective layer on an entirety of the inner wall of the via-hole including the first protective layer; and filling a conductive material within the via-hole to form a plug.

19. The method of manufacturing a semiconductor device according to claim 18, wherein said forming a low dielectric constant insulating layer is conducted by a spin coating method.

20. The method of manufacturing a semiconductor device according to claim 18, wherein the low dielectric constant insulating layer includes silsesquioxane.

21. The method of manufacturing a semiconductor device according to claim 18, wherein said forming a conductive pattern includes:

forming an aluminum alloy layer on the semiconductor substrate;

forming an antireflection metal layer on the aluminum alloy layer; and patterning the aluminum alloy layer and the antireflection metal layer to form the conductive pattern.

22. The method of manufacturing a semiconductor device according to claim 18, wherein the via-hole exposes an edge portion of the conductive pattern.

23. The method of manufacturing a semiconductor device according to claim 18, wherein a residue is deposited near a bottom portion of the inner wall of the via-hole during said subjecting the resist pattern and the via-hole to oxygen reactive plasma.

24. The method of manufacturing a semiconductor device according to claim 18, wherein $WF_6$ gas is used during said filling a conductive material.

25. The method of manufacturing a semiconductor device according to claim 18, wherein the second protective layer includes tetraethylorthosilicate.

* * * * *